United States Patent
De Jongh et al.

(10) Patent No.: US 9,857,698 B2
(45) Date of Patent: Jan. 2, 2018

(54) LITHOGRAPHIC APPARATUS AND DEVICE MANUFACTURING METHOD

(71) Applicant: ASML Netherlands B.V., Veldhoven (NL)

(72) Inventors: Robertus Johannes Marinus De Jongh, Eindhoven (NL); Leon Leonardus Franciscus Merkx, Eindhoven (NL); Roel Johannes Elisabeth Merry, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/303,478

(22) PCT Filed: Mar. 19, 2015

(86) PCT No.: PCT/EP2015/055783
§ 371 (c)(1),
(2) Date: Oct. 11, 2016

(87) PCT Pub. No.: WO2015/158487
PCT Pub. Date: Oct. 22, 2015

(65) Prior Publication Data
US 2017/0038693 A1    Feb. 9, 2017

(30) Foreign Application Priority Data

Apr. 17, 2014  (EP) .................................. 14165170

(51) Int. Cl.
G02B 27/54    (2006.01)
G03F 7/20     (2006.01)
G02B 7/182    (2006.01)

(52) U.S. Cl.
CPC ....... *G03F 7/70775* (2013.01); *G02B 7/1828* (2013.01); *G03F 7/70258* (2013.01); *G03F 7/70758* (2013.01); *G03F 7/70825* (2013.01)

(58) Field of Classification Search
CPC .......................... G03F 7/70775; G03F 7/70258
USPC .................. 355/53, 67, 72–76; 359/819–820
See application file for complete search history.

(56) References Cited

U.S. PATENT DOCUMENTS

| | | | |
|---|---|---|---|
| 2009/0050776 A1 | 2/2009 | Muehlbeyer et al. | |
| 2009/0135395 A1* | 5/2009 | Melzer ................... | G02B 7/023 355/67 |
| 2009/0174876 A1 | 7/2009 | Schriever et al. | |
| 2009/0225297 A1 | 9/2009 | Bleidistel et al. | |

(Continued)

OTHER PUBLICATIONS

International Search Report and Written Opinion dated Jul. 2, 2015 in corresponding International Patent Application No. PCT/EP2015/055783.

*Primary Examiner* — Hung Henry Nguyen
(74) *Attorney, Agent, or Firm* — Pillsbury Winthrop Shaw Pittman LLP (57) ABSTRACT

A lithographic apparatus includes a reflector to redirect a radiation beam, e.g. an EUV beam. The position of the reflector is controlled using a controller and a positioning system. The positioning system includes a non-compensating actuator device and a compensating actuator device to compensate for parasitic forces of the non-compensating actuator device. The positioning system and controller can provide a more accurate position of the reflector, reduce deformation of the reflector and reduce the magnitude of forces transmitting through the reflector.

20 Claims, 5 Drawing Sheets

(56) References Cited

U.S. PATENT DOCUMENTS

2010/0195085 A1    8/2010  Fuse
2010/0201964 A1    8/2010  Kugler et al.
2010/0243622 A1*   9/2010  Kosmowski ....... B23K 26/0853
                                                 219/121.67

* cited by examiner

LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2015/055783, which was filed on Mar. 19, 2015, and which claims the benefit of priority of EP Patent Application No. 14165170.3, filed on Apr. 17, 2014, which is incorporated by reference herein in its entirety.

FIELD

The present invention relates to a lithographic apparatus and a device manufacturing method. In particular, the invention relates to a system for controlling a reflector within a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning" direction) while synchronously scanning the substrate parallel or anti-parallel to this direction.

In order to reduce the size of the features of the circuit pattern, it is necessary to reduce the wavelength of the imaging radiation. To this end, lithographic apparatus using EUV radiation, e.g. having a wavelength in the range of from about 5 nm to 20 nm, are under development. EUV radiation is strongly absorbed by almost all materials, therefore the optical systems and mask must be reflective and the apparatus kept under a low pressure or vacuum. Any errors in directing the imaging radiation within a lithographic apparatus will have a greater impact on any errors, e.g. the overlay error, when the imaging radiation being used has a reduced wavelength, i.e. EUV.

SUMMARY

Reflectors are used in patterning means to position a pattern image on the radiation beam. The image in the radiation beam is projected onto the substrate, which is highly sensitive to the position of the image. Therefore, a greater degree of accuracy of the position of objects within a lithographic apparatus, for example reflectors, is required to maintain, or preferably even reduce to acceptable levels, the overlay error or any error of the pattern in the radiation beam. In general, there are many objects which need to be positioned accurately within an apparatus, e.g. a lithographic apparatus, therefore, any improvement in accuracy of a control system for positioning an object will provide a benefit.

Therefore, it is desirable to provide an improved system for controlling the position of reflectors and/or other components in a lithographic apparatus, especially for an apparatus using EUV radiation.

According to an aspect of the invention, there is provided a lithographic apparatus comprising: a reflector; a positioning system configured to position the reflector in N degrees of freedom, wherein N is a positive integer, the positioning system comprising M actuator devices, each actuator device being configured to apply a force to the reflector, and M being a positive integer greater than N, wherein at least one of the actuator devices is a compensating actuator device and at least one other of the actuator devices is a non-compensating actuator device; and a controller configured to control a compensating actuator device and a non-compensating actuator device wherein the controller is configured to control the compensating actuator device to compensate for parasitic forces of the non-compensating actuator device, wherein the compensating actuator device and the non-compensating actuator device are configured to apply a force to the reflector at the same point thereon.

According to an aspect of the invention, there is provided an apparatus comprising a positioning system of the present invention, wherein the apparatus further comprises an object.

According to an aspect of the invention, there is provided a method for compensating the vibration of an object using a positioning system of the present invention.

According to an aspect of the invention, there is provided a device manufacturing method comprising projecting a projection beam of radiation via a reflector onto a substrate positioned on a substrate table, wherein a positioning system is configured to position the reflector in N degrees of freedom, wherein N is a positive integer, the positioning system comprising M actuator devices, each actuator device being configured to apply a force to the reflector, and M being a positive integer greater than N, wherein at least one of the actuator devices is a compensating actuator device and at least one other of the actuator devices is a non-compensating actuator device; and a controller is configured to control a compensating actuator device and a non-compensating actuator device wherein the controller is configured to control the compensating actuator device to compensate for parasitic forces of the non-compensating actuator device, wherein the compensating actuator device and the non-compensating actuator device are configured to apply a force to the reflector at the same point thereon.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
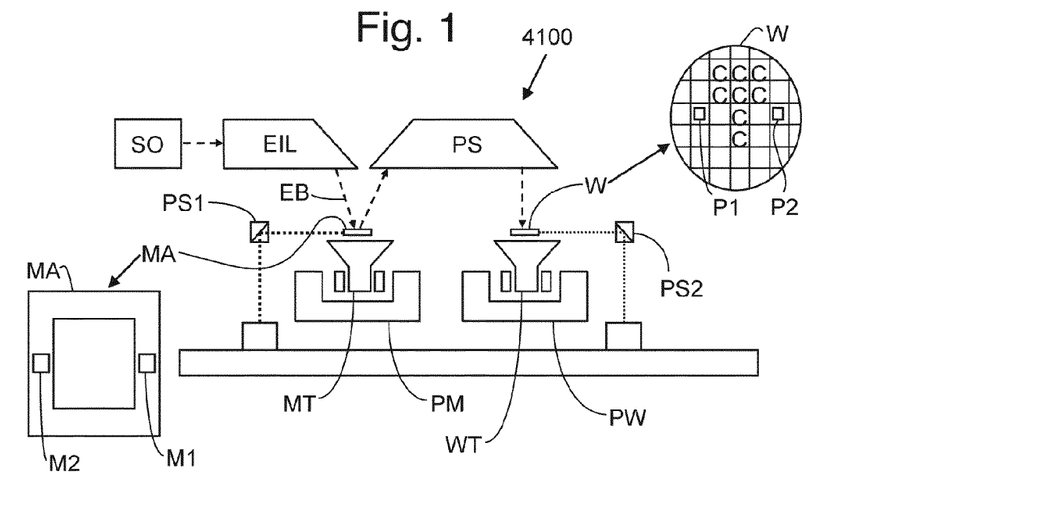
FIG. 1 depicts a lithographic apparatus used in an embodiment of the present invention.

FIG. 1 schematically depicts an EUV lithographic apparatus 4100 including a source collector apparatus SO. The apparatus comprises:

- an illumination system (illuminator) EIL configured to condition a radiation beam EB (e.g. DUV radiation or EUV radiation);
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist-coated wafer) W and connected to a second positioner PW configured to accurately position the substrate; and
- a projection system (e.g. a reflective projection system) PS configured to project a pattern imparted to the radiation beam EB by patterning device MA onto a target portion C (e.g. comprising one or more dies) of the substrate W.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device".

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

Examples of patterning devices include masks and programmable mirror arrays. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The lithographic apparatus may be of a type having two or more substrate support structures, such as substrate stages or substrate tables, and/or two or more support structures for patterning devices. In an apparatus with multiple substrate stages, all the substrate stages can be equivalent and interchangeable. In an embodiment, at least one of the multiple substrate stages is particularly adapted for exposure steps and at least one of the multiple substrate stages is particularly adapted for measurement or preparatory steps. In an embodiment of the invention one or more of the multiple substrate stages is replaced by a measurement stage. A measurement stage includes at least a part of one or more sensor systems such as a sensor detector and/or target of the sensor system but does not support a substrate. The measurement stage is positionable in the projection beam in place of a substrate stage or a support structure for a patterning device. In such apparatus the additional stages may be used in parallel, or preparatory steps may be carried out on one or more stages while one or more other stages are being used for exposure.

In an EUV lithographic apparatus, it is desirable to use a vacuum or low pressure environment since gases can absorb too much radiation. A vacuum environment can therefore be provided to the whole beam path with the aid of a vacuum wall and one or more vacuum pumps.

Referring to FIG. 1, the EUV illuminator EIL receives an extreme ultraviolet radiation beam from the source collector apparatus SO. The source collector apparatus SO is described in more detail below. In outline, a material (which may be referred to as the fuel) that has at least one element, e.g., xenon (Xe), lithium (Li) or tin (Sn), with one or more emission lines in the EUV range is converted into a plasma state. This is achieved by irradiating a droplet, stream or cluster of the fuel with a laser beam. The resulting plasma emits output radiation, e.g., EUV radiation, which is collected using a radiation collector, disposed in the source collector apparatus.

Different arrangements of the parts of the radiation system are possible. For example, a laser and a source collector apparatus may be separate entities, for example when a $CO_2$ laser is used to provide the laser beam for fuel excitation. In such cases, the laser is not considered to form part of the lithographic apparatus and the radiation beam is passed from the laser to the source collector apparatus with the aid of a beam delivery system comprising, for example, suitable directing mirrors and/or a beam expander.

The EUV illuminator EIL may comprise an adjuster to adjust the angular intensity distribution of the radiation beam EB. Generally, at least the outer and/or inner radial extent (commonly referred to as σ-outer and σ-inner, respectively) of the intensity distribution in a pupil plane of the illuminator can be adjusted. In addition, the EUV illuminator EIL may comprise various other components, such as facetted field and pupil mirror devices. The EUV illuminator EIL may be used to condition the radiation beam EB, to have a desired uniformity and intensity distribution in its cross section.

The radiation beam EB is incident on the patterning device (e.g., mask) MA, which is held on the support structure (e.g., mask table) MT, and is patterned by the patterning device. After being reflected from the patterning device (e.g. mask) MA, the radiation beam EB passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam EB. Similarly, the first positioner PM and another position sensor PS1 can be used to accurately position the patterning device (e.g. mask) MA with respect to the path of the radiation beam EB. Patterning device (e.g. mask) MA and substrate W may be aligned using mask alignment marks M1, M2 and substrate alignment marks P1, P2.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

A control system (not shown) controls the overall operations of the lithographic apparatus and in particular performs an optimization process described further below. The control system can be embodied as a suitably-programmed general purpose computer comprising a central processing unit and volatile and non-volatile storage. Optionally, the control system may further comprise one or more input and output devices such as a keyboard and screen, one or more network connections and/or one or more interfaces to the various parts of the lithographic apparatus. It will be appreciated that a one-to-one relationship between controlling computer and lithographic apparatus is not necessary. In an embodiment of the invention one computer can control multiple lithographic apparatuses. In an embodiment of the invention, multiple networked computers can be used to control one lithographic apparatus. The control system may also be configured to control one or more associated process devices and substrate handling devices in a lithocell or cluster of which the lithographic apparatus forms a part. The control system can also be configured to be subordinate to a supervisory control system of a lithocell or cluster and/or an overall control system of a fab.

Figure 2:
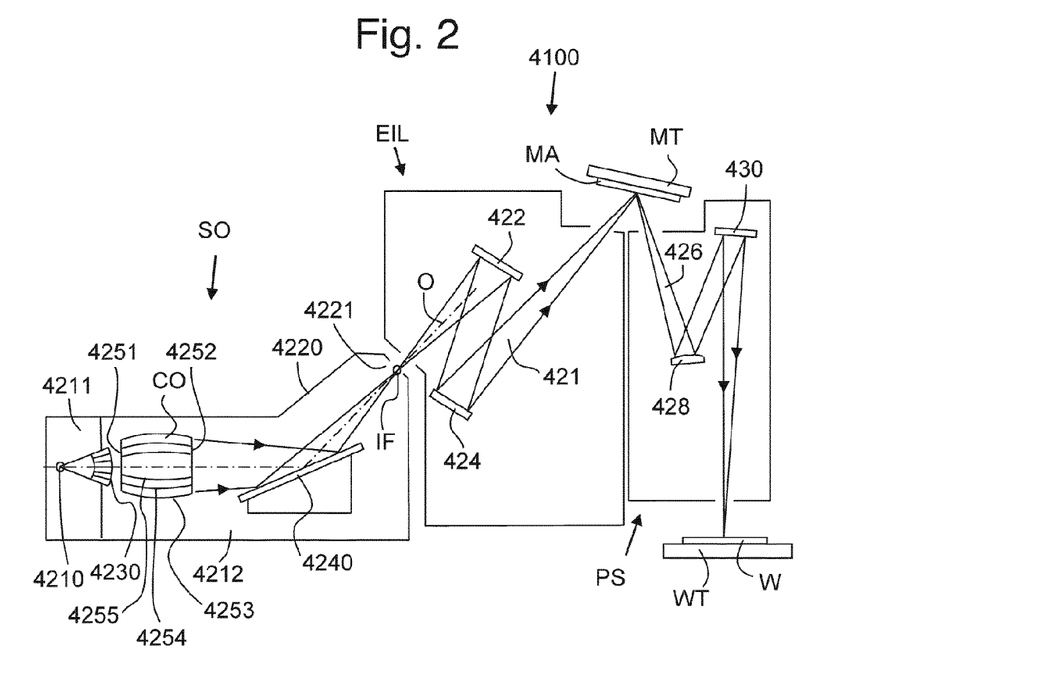
FIG. 2 is a more detailed view of the main optical path of the apparatus of FIG. 1.

FIG. 2 shows the EUV apparatus 4100 in more detail, including the source collector apparatus SO, the EUV illumination system EIL, and the projection system PS. The source collector apparatus SO is constructed and arranged such that a vacuum environment can be maintained in an enclosing structure 4220 of the source collector apparatus SO. An EUV radiation emitting plasma 4210 may be formed by a discharge produced plasma source. EUV radiation may be produced by a gas or vapor, for example Xe gas, Li vapor or Sn vapor in which the plasma 4210 is created to emit radiation in the EUV range of the electromagnetic spectrum. The plasma 4210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the plasma 4210 is passed from a source chamber 4211 into a collector chamber 4212 via an optional gas barrier and/or contaminant trap 4230 (in some cases also referred to as contaminant barrier or foil trap) which is positioned in or behind an opening in source chamber 4211. The contaminant trap 4230 may include a channel structure. Contamination trap 4230 may also include a gas barrier or a combination of a gas barrier and a channel structure. The contaminant trap or contaminant barrier 4230 further indicated herein at least includes a channel structure, as known in the art.

The collector chamber 4212 may include a radiation collector CO which may be a so-called grazing incidence collector. Radiation collector CO has an upstream radiation collector side 4251 and a downstream radiation collector side 4252. Radiation that traverses collector CO can be reflected by a grating spectral filter 4240 to be focused in a virtual source point IF. The virtual source point IF is commonly referred to as the intermediate focus, and the source collector apparatus is arranged such that the intermediate focus IF is located at or near an opening 4221 in the enclosing structure 4220. The virtual source point IF is an image of the radiation emitting plasma 4210.

Subsequently the radiation traverses the illumination system EIL, which may include a facetted field mirror device 422 and a facetted pupil mirror device 424 arranged to provide a desired angular distribution of the radiation beam 421, at the patterning device MA, as well as a desired uniformity of radiation intensity at the patterning device MA. Upon reflection of the beam of radiation 421 at the patterning device MA, held by the support structure MT, a patterned beam 426 is formed and the patterned beam 426 is imaged by the projection system PS via reflective elements 428, 430 onto a substrate W held by the substrate stage or substrate table WT.

More elements than shown may generally be present in illumination optics unit IL and projection system PS. The grating spectral filter 4240 may optionally be present, depending upon the type of lithographic apparatus. There may be more mirrors present than those shown in the Figures, for example there may be from 1 to 6 additional reflective elements present in the projection system PS than shown in FIG. 2.

Collector optic CO, as illustrated in FIG. 2, is depicted as a nested collector with grazing incidence reflectors 4253, 4254 and 4255, just as an example of a collector (or collector mirror). The grazing incidence reflectors 4253, 4254 and 4255 are disposed axially symmetric around an optical axis O and a collector optic CO of this type is preferably used in combination with a discharge produced plasma source, often called a DPP source.

In the prior art, actuator devices are used to control the position of reflectors within a lithographic apparatus. Each actuator device is used to apply a controlling force to a reflector such that the reflector will move in a desired direction. Each actuator is configured to control the reflector in one degree of freedom. Actuator devices can be used to control any of the field mirror device 422, the facetted pupil mirror device 424, reflective elements 428 and 430, the patterning device MA, the reflectors within the collector e.g. grazing incidence reflectors 4253, 4254 and 4255 and/or any other mirror and/or reflector within the lithographic apparatus (even if not shown). Any use of the term "mirror" herein may be considered synonymous with the more general term "reflector".

A position controller is used to calculate a desired force to be applied to an object, for example to a reflector, by each actuator device. In the prior art one actuator device is used to control the position of a reflector for each degree of freedom of the reflector which is to be controlled, i.e. there is a one-to-one relationship between the degrees of freedom of the reflector being controlled and the number of actuator devices. This relationship allows the position of the reflector to be fully controlled. The same number of actuators as degrees of freedom are used in the prior art to avoid putting any stress in the reflector.

A reflector has been used as an example throughout the application because the accuracy of the reflector position effectively illustrates the level of accuracy required by the actuator devices of the present invention, as well as the advantages of precisely controlling a component within an apparatus, such as a lithographic apparatus. A reflector could be exchanged with another object or component as described later in the application.

Differences between the actual force applied by each actuator device compared to the desired force to be applied by each actuator device can induce an error in the direction of the reflected beam. The component of any force having a direction different than the desired direction of the force can be referred to as a parasitic force. The actuator of the prior art are controlled to try to avoid parasitic forces by adjusting the forces applied by the actuators.

Often the force applied by the actuator device is not applied entirely accurately in the intended direction which results in the parasitic forces. The term "parasitic force" is used to refer to unwanted forces and unwanted torques. The discrepancies in the applied force can be due to mounting tolerances, magnet variations and position of the reflector. These discrepancies result in the parasitic force acting on the reflector. The parasitic force is the force (and/or torque) not in the intended direction, as such, the parasitic force is orthogonal to the intended direction.

Additionally, there are dynamic effects due to oscillation modes of the actuator (as is described in more detail below) which affect the control loop controlling the reflector position. The dynamic behavior of the actuator limits the bandwidth of the control loop. Therefore, oscillations of different frequencies are detected and factored into the control loop by the controller in different ways.

The errors due to the discrepancies of the applied force have been reduced in the prior art by keeping the mechanical tolerances small, limiting the number of degrees of freedom of each actuator (e.g. using one actuator to apply a translation force on the reflector in one direction only), and limiting the stiffness of the connection between the actuator and the reflector for example, in the non-actuated direction.

The position controller can adapt the actuator to alter the force applied to the reflector to take some of the above mentioned factors into account. The position controller can determine a desired force in other actuator devices to reduce, or negate, the parasitic forces applied by an actuator device. Therefore, forces applied by the actuator devices at other points on the reflector can be used to compensate for the parasitic forces in another actuator device. In this way, the forces applied to the reflector can be resolved to reduce the net parasitic forces acting on the reflector. Ideally, the net parasitic forces acting on the reflector are zero so that the reflector will not move in a direction other than the desired direction.

However, there are problems in the prior art because the prior art varies the forces applied by the actuators across the reflector, these forces are transmitted through the reflector. These forces being transmitted through the reflector lead to deformities occurring in the reflector. Any deformities in the reflector e.g. the shape of the reflector being deformed, can induce errors. An error in the position of the reflector, a deformity of the reflector and/or an error in the reflected radiation beam can result in overlay error, focus problems and/or fading problems. In particular, overlay error can have a significant impact on the quality of the substrate which is produced.

Figure 3A:
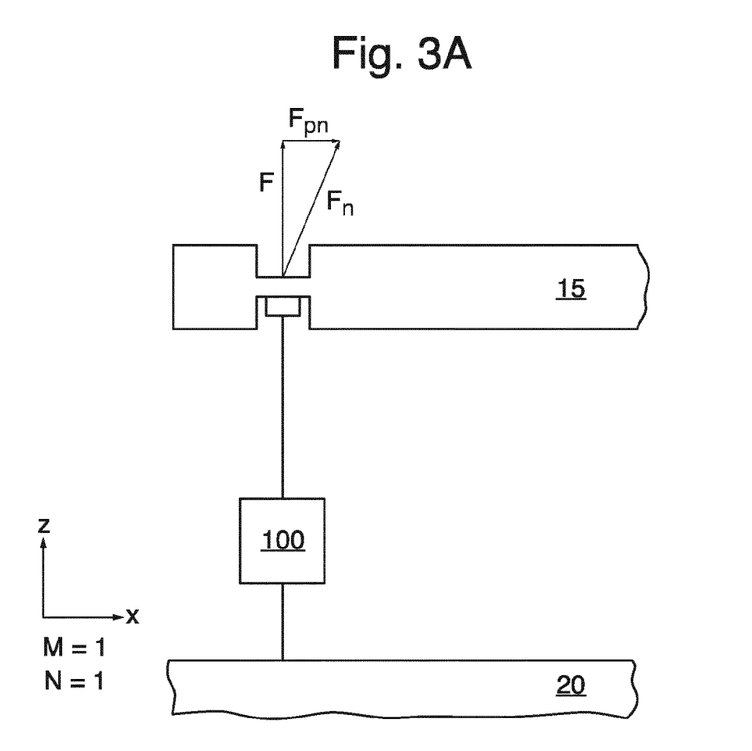
FIG. 3A depicts an actuator device for use in a lithographic apparatus.

A simple model of an example positioning system in a prior art is shown in FIG. 3A, which shows an actuator device 100 applying a force Fn to a reflector 15. The figure shows one actuator device 100 (M=1) which is controlled to position the reflector 15 in one degree of freedom (N=1). The desired force in this example is in the z-direction only. The position controller will be used to control the force applied by the actuator device 100 to reduce the difference in the force applied compared to the desired force, i.e. the error. In cases where multiple actuator devices are used, the controller can factor in the forces applied by other actuator devices.

As can be seen, the actual force Fn applied by the actuator device 100 has a force component Fpn in the x-direction as well as a force component F in the z-direction. The component of the force in the x-direction, Fpn, is a parasitic force i.e. an unwanted force which is likely to induce an error in the position of the reflector 15.

The present invention addresses the problems of the prior art which are described above. The embodiments of the present invention which address these problems are described below in detail with respect to the drawings.

In the present invention, a lithographic apparatus is provided comprising a reflector and a positioning system configured to position the reflector in N degrees of freedom (N is a positive integer). The positioning system comprises M actuator devices (M is a positive integer), each actuator device being configured to apply a force to the reflector.

A controller is configured to control the actuator devices. In particular, the controller controls a compensating actuator device and a non-compensating actuator device wherein the controller controls the compensating actuator device to compensate for parasitic forces of the non-compensating actuator device.

Figure 3B:
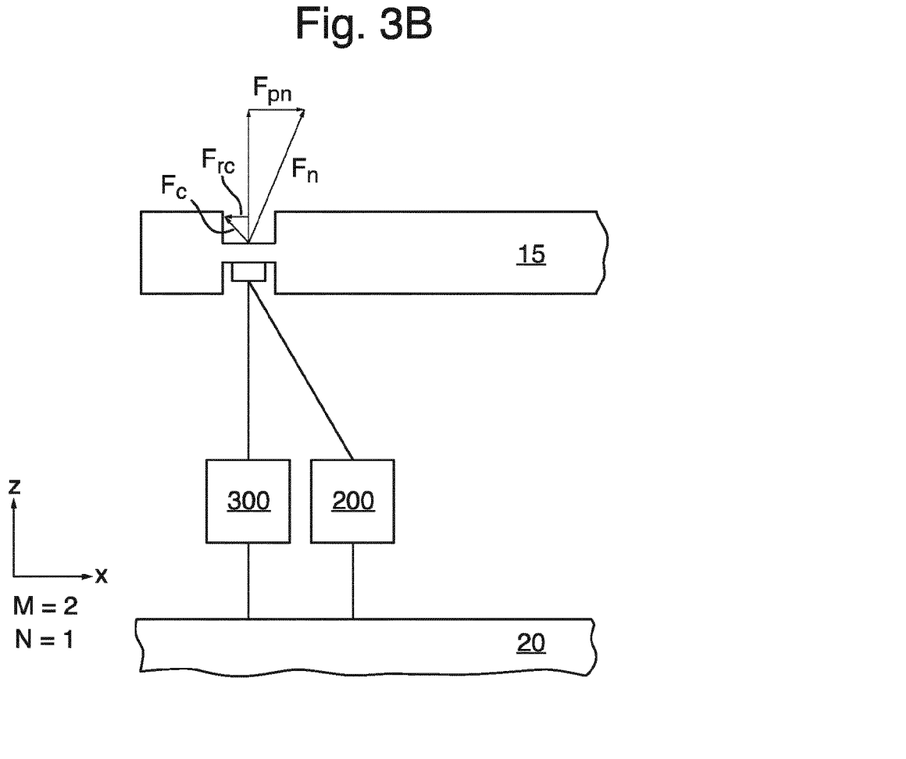
FIG. 3B depicts a compensating actuator device and a non-compensating actuator device in accordance with an embodiment of the present invention.

A first embodiment of the present invention is depicted in FIG. 3B. As shown in FIG. 3B, the positioning system is configured to position the reflector 15 in one degree of freedom (N=1), i.e. the z-direction. In this embodiment, two actuator devices (M=2) are provided. In this embodiment, one of the actuator devices is a compensating actuator device 200 and the other actuator device is a non-compensating actuator device 300. The non-compensating actuator device 300 can be the same as, and/or can apply the same force as, the actuator device 100 depicted in FIG. 3A. The non-compensating actuator device 300 applies force Fn to the reflector 15, the force Fn having a component Fpn in the x-direction, and a component in the z-direction, which is the direction of the desired force.

In this embodiment, N is the number of degrees of freedom. N non-compensating actuator devices are provided in the present embodiment to control all the degrees of freedom and M-N compensating actuator devices are provided.

In the present embodiment, as shown in FIG. 3B, the compensating actuator device 200 is included, in addition to non-compensating actuator device 300 (which is equivalent to the actuator device 100 shown in FIG. 3A). The compensating actuator device 200 applies a compensating force Fc on the reflector 15, the force Fc having a component Frc, in the x-direction, and a component in the z-direction. In the present invention, a greater number of actuator devices are used than the degrees of freedom which are being controlled i.e. M is greater than N. Using more actuator devices than the degrees of freedom being controlled can be referred to as "overactuation".

Figure 3C:
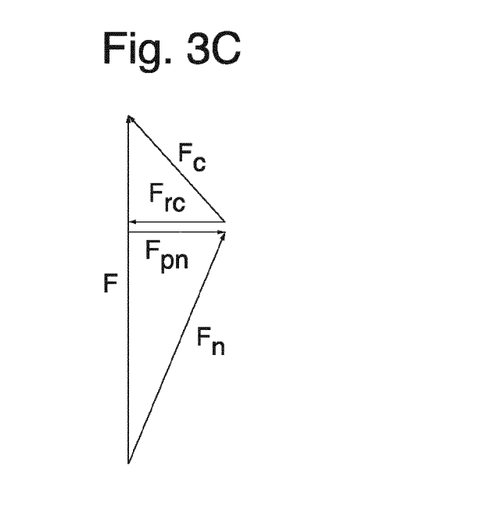
FIG. 3C depicts a forces diagram of the forces applied on the reflector by the actuator devices of FIG. 3B.

FIG. 3C depicts a force diagram showing the force Fn applied by the non-compensating actuator device 300 and the force Fc applied by the compensating actuator device 200. The controller 50 is configured to control the compensating actuator device 200 and the non-compensating actuator device 300 such that the compensating actuator device 200 compensates for parasitic forces of the non-compensating actuator device 300 (Fpn in FIGS. 3A and 3B). The force diagram of FIG. 3C shows how the forces applied by the actuator devices can be controlled to reduce the parasitic forces (i.e. the force in an unwanted direction, in this case, in the x-direction).

As shown in FIG. 3C, the component of the two forces in the x-direction cancel each other such that the forces in the x-direction are opposite in direction and equivalent in magnitude. As such, the sum of these forces is zero. The forces applied by the compensating and non-compensating actuator devices can have a resultant force F in the z-direction. The compensating actuator device 200 and the non-compensating actuator device 300 can be controlled to reduce or avoid parasitic forces (in this example of the embodiment, in the x-direction).

In the present embodiment, the compensating actuator device 200 and non-compensating actuator device 300 are configured to apply force to the reflector 15 at the same point thereon. Applying forces from different devices at the same point means that the forces can be resolved at the point of contact between the actuator devices and the reflector 15. Therefore, the forces are resolved at the contact rather than bring transmitted through the reflector. In FIG. 3B, the forces are shown just above the point of contact on the reflector 15 to more clearly show the forces.

The forces being applied at the same point may mean that multiple actuators have a very small contact zone on the reflector, whereby each actuator device (at the point) applies a force at a point on the reflector close to, and ideally as close as possible to, the force(s) applied to the reflector by any adjacent actuator(s). In this way, multiple contact points from adjacent actuator devices can be applied at "the same point". This has the same advantages as described above in that the forces are resolved at the same point and therefore, are not passed through the mirror to other different points, and can be localized or controlled depending on the contact points made with the reflector. Alternatively, the forces being applied at the same point may mean that multiple actuators may be configured to contact the reflector at a single contact point on the reflector. To apply a force at a single contact point, rather than multiple contact points in close proximity, the compensating actuator device (s) and the non-compensating actuator device(s) at the same point may be connected to each other before contacting the reflector. As such, the forces from the compensating actuator device(s) and the non-compensating actuator device(s) can be resolved relative to each other, and a resolved force in a single direction at a single contact point is applied to the reflector. This has the advantage that the stresses in the reflector are reduced because fewer forces are resolved in the reflector.

The actuator devices are controlled by a controller 50 configured to control a compensating actuator device 200 and a non-compensating actuator device 300. The controller 50 is configured to control the compensating actuator device 200 to compensate for parasitic forces of the non-compensating actuator device 300. The controller 50 can control the compensating actuator device 200 and/the non-compensating actuator device 300 to apply a linear force to the reflector 15 at the point of contact on the reflector 15. The controller 50 can control the compensating actuator device 200 and/or the non-compensating actuator device 300 to apply a rotational force (i.e. a torque) at the contact point of the reflector 15.

The controller 50 may use information provided from at least one sensor. A sensor can be used to measure the movement and/or position of the reflector 15. Information indicating the movement and/or position of the reflector 15 can be sent from the sensor to the controller 50. The controller 50 can use this information in a transfer function, e.g. a feedback control loop, to determine the difference between the desired position of the reflector 15 compared to (for example, the most up-to-date) information of the actual position of the reflector 15. The controller 50 can use information received from the sensors and any pre-existing or model-based stored information.

The controller 50 can use the above mentioned information to determine the forces which need to be applied, and controls the compensating actuator device 200 and the non-compensating actuator device 300 in accordance with the calculated desired forces. The controller 50 can therefore adjust the forces applied by the actuator devices to reduce the error in the position of the reflector 15.

One or more sensors can be used to provide the controller 50 with the required information. The same type of sensor may be used to measure information in relation to one reflector 15. Alternatively, different types of sensor may be used. For example, the sensor can be an interferometer, an encoder, a capacitive sensor, an eddy current sensor, or a position sensor combined with an accelerometer of a velocity sensor. Preferably, the sensor is contact free.

The controller 50 of the present invention can be the same as the control system which controls the overall operation of the lithographic apparatus. Alternatively, the controller 50 of the present invention may be different from the control system that controls the overall operations of the lithographic apparatus.

The controller 50 will calibrate the actuator devices such that the forces applied by the actuator devices can be adapted to reduce the parasitic forces. The calibration can be done in several ways for example using a time or frequency domain calibration. Time domain calibration can be carried out by switching off actuator devices one at a time. This calibration allows the forces applied by each actuator device to be determined. Alternatively, the relationship between the forces and the reflector 15 can be determined in the frequency domain by detecting the cross-talk between points at which force is applied to the reflector 15. Reducing the cross-talk of forces transmitting through the reflector 15 to other points will reduce the parasitic forces on the reflector 15.

Figure 4:
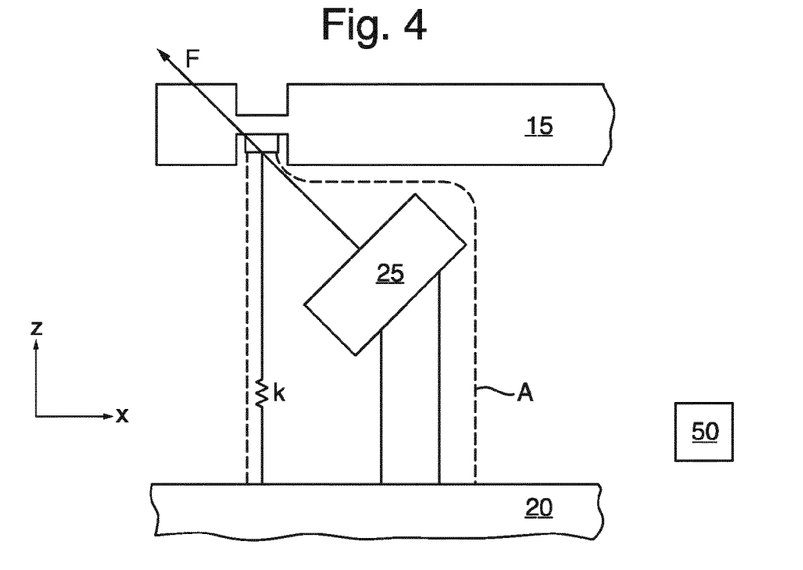
FIG. 4 depicts a representation of an actuator device.

A simplified representation of the actuator device A is depicted in FIG. 4. In this embodiment, each actuator device has an actuator 25 connected to the reflector 15 and a supporting frame 20. The connection between the actuator 25 and the reflector 15 can comprise a spring. The connection between the actuator 25 and the supporting frame 20 can comprise a spring. Any of the connections may comprise more than one spring, which are in series and/or parallel with each other. All the connections may be made using at least one spring (as depicted in FIG. 5).

The actuator device A can be used for any of the above-mentioned actuator devices whether they are compensating or non-compensating actuator devices, including the actuator devices 100, 200 and 300 of FIGS. 3A and 3B. In the representation shown in FIG. 4 the actuator 25 of the actuator device A applies a force F to the reflector 15. The overall connection between the reflector 15 and the support frame 20 is represented as a simple spring having a stiffness k. The actuator device of the present embodiment is described in more detail with reference to FIG. 5, which shows a detailed example of the actuator device A including the connections between the actuator 25 and the reflector 15 (reflector not shown), and the actuator 25 and the support frame 20. The actuator device A shown in FIG. 5 could be any one of the above mentioned actuator devices e.g. 100, 200 or 300.

Figure 5:
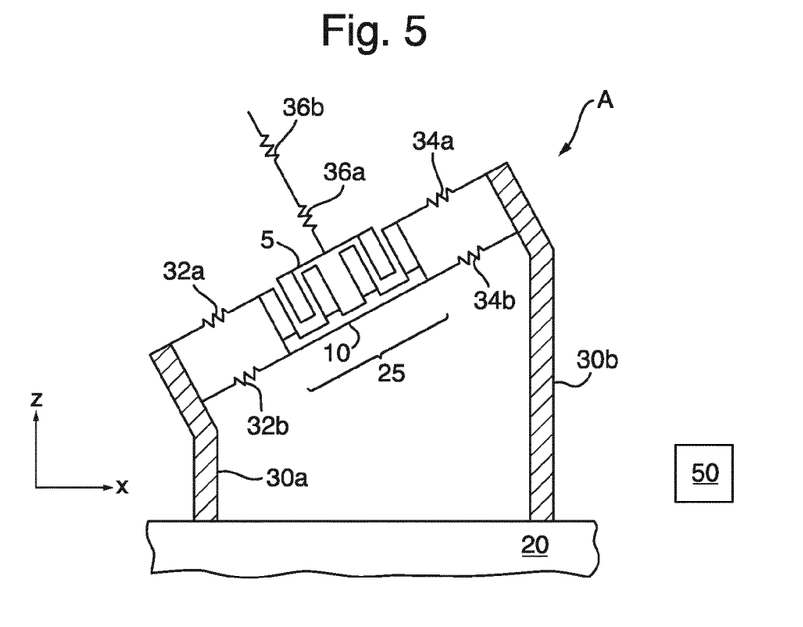
FIG. 5 is a detailed view of an actuator device for use in an embodiment of the present invention.

As is shown in FIG. 5 the actuator device A is modeled as an actuator 25 connected to a support frame 20 wherein the actuator has a weak spring connection to the reflector 15 and a weak spring connection to the support frame 20. Two support arms 30a and 30b are attached to the support frame 20. The actuator is connected to the support arm 30a via two parallel springs 32a and 32b. The actuator is connected to support arm 30b via two parallel springs 34a and 34b. The actuator is connected to the reflector 15 using two springs in series, 36a and 36b.

Each of the springs 32a, 32b, 34a, 34b, 36a and 36b has a predetermined stiffness. The stiffness of the springs is relatively low such that the connections between the supporting frame 20 and the actuator 25, and the actuator 25 and the reflector 15, are weak. It is beneficial to have weak connections such that vibrations on the supporting frame 20 do not influence the reflector 15 and displacements of the reflector 15 with respect to the supporting frame 20 will not result in large forces. The springs can have the same or different stiffnesses.

The dynamic relationship of the connection between the reflector 15 and the actuator is dominated by springs 36a and 36b. There are different oscillation modes at this connection due to springs 36a and 36b. The lowest oscillation modes are bending modes at low frequencies. The frequencies are low because of the low stiffness of the connections, which must be kept low to reduce parasitic forces when altering the position of the reflector 15. Alternatively, the connection works as a shock absorber. The frequency of this mode can be tuned such that the bandwidth requirement of the feedback control loop can be met. At higher frequencies, various modes occur which as a consequence limit the bandwidth of the controller 50.

The springs 32a, 32b, 34a and 34b can be very stiff, in which case any reaction forces would be fed from the actuator 25 to the support frame 20. When the springs 32a, 32b, 34a and 34b are very stiff the actuator 25 has to compensate for relatively large parasitic effects of the high stiffness. Alternatively, if the springs 32a, 32b, 34a and 34b are very weak, they act as a mechanical filter of the reaction forces. It is generally beneficial to select the stiffness of the springs 32a, 32b, 34a and 34b such that they are in the region which does not have resonate modes which would interfere with the controller bandwidth.

Different concepts are applicable for determining the optimum stiffness of 36a and 36b. In an example of an actuator used in the prior art, 36a and 36b are "quite" stiff in the actuation direction and rather weak in the other direction. In this way the forces are efficiently transmitted from the actuator to the reflector 15 in one direction. In this case, quite stiff means that the stiffness is high enough that it is not dominating the total dynamic behaviour of the control loop but it is not too stiff that the parasitic stiffness greatly increases. There is an optimum ratio of stiffnesses of the springs in different directions.

In the present invention, the same actuators may be used, but there is more freedom relative to the prior art in selecting the stiffnesses of the springs because although an increase in the stiffness increases the parasitic forces, the present invention provides compensating actuator devices which are used to reduce these parasitic forces.

The dynamic effects of the actuator devices can be reduced by overactuation. Therefore, even the dynamic effects of the connections between the actuator and the support frame 20 and the actuator and the reflector 15 may be reduced. The effect of the oscillations of the actuator due to the spring connections can be reduced such that the bandwidth of the controller 50 of the reflector 15 can be increased. This increases the control on the position of the reflector 15 which reduces overlay error as previously described.

The actuator 25 shown in FIG. 5 is a Lorenz actuator having a coil assembly 5 and a magnetic assembly 10. The Lorentz actuator can be replaced with another type of actuator for use in accordance with the present invention. In particular, other types of contactless actuator can be used, for example a reluctance actuator. Alternatively, a planar motor could be used to provide two actuators.

An advantage of the present invention is that because the actuators are controlled to reduce parasitic forces in accordance with the control loop, mechanical tolerances are less critical. Therefore, the effect of mechanical errors within a lithographic apparatus is reduced because the force applied by the actuators will account for these errors when determining the desired position of the reflector 15, and how much force to apply. Additionally, any reduction in errors within the system will improve the efficiency of the lithographic apparatus and will mean that the apparatus can produce substrates (which have been correctly patterned) at a faster rate. The present invention improves the imaging quality. Additionally, because the positioning system of the present invention factors in any errors in the original position of components within the apparatus, using a positioning system can result in a less complex assembly process wherein the impact of an initial positioning error is reduced.

Variations of the present embodiment include a positioning system which controls the reflector 15 in a greater number of degrees of freedom, i.e. N is greater than 1. Accordingly, when the number of degrees of freedom being controlled by the positioning system is increased, the number of actuators M must also be increased such that there is always at least one more actuator than degrees of freedom. Using a greater number of actuators and degrees of freedom allows the reflector 15 to be "overactuated" in accordance with the present invention.

The number of actuators may be varied whether or not the number of degrees of freedom is altered. However, as mentioned above, the number of actuators M must be greater than the number of degrees of freedom N.

In the first embodiment, two actuator devices apply a force to a reflector 15 at the same point. The number of points P at which a force is applied is applied to the reflector 15 can be varied.

In the above embodiment or variations as described, additional actuators may be included to apply a force to the reflector 15. The additional actuators can apply a force to the same point on the reflector 15, as in the first embodiment. Alternatively, the additional actuators can be used to apply a force to different point on the reflector 15. Even if an additional non-compensating actuator device and/or an additional compensating actuator device apply forces at different points, overactuating the reflector 15 (i.e. when M is greater than N) still provides benefits. The distance through which forces are transmitted through the reflector 15 can be reduced compared to when the reflector 15 is not overactuated. By overactuating the reflector 15, the path of the forces through the reflector 15 can be controlled. In this way, it is possible to resolve the forces through the reflector 15 in desired regions, and avoid transmitting forces through the reflector 15 in other regions.

A second embodiment is described having a specific number of degrees of freedom N, actuator devices M, and points P at which the actuator devices apply force to the reflector 15.

Parts of the second embodiment that are the same as or correspond to parts of the first embodiment are identified with like references. Only aspects of the second embodiment which differ from the first embodiment are described below.

The second embodiment has a positioning system to control the reflector 15 in six degrees of freedom (N=6). Nine actuator devices are used (M=9) which apply force to the reflector 15 at three separate points (P=3).

Figure 6A:
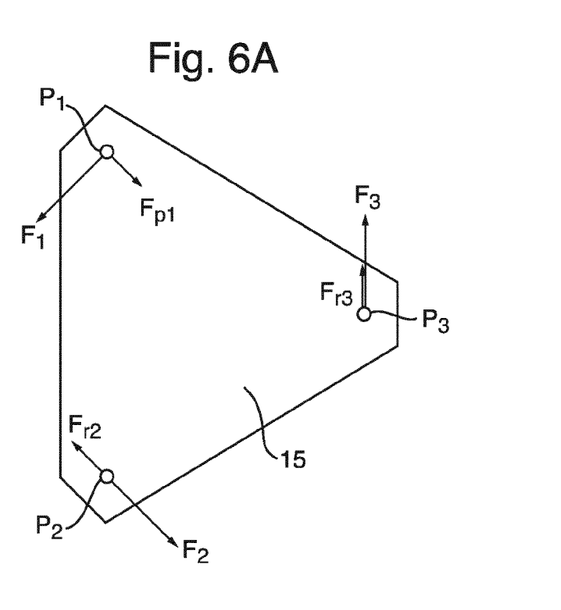
FIG. 6A shows the forces acting at various points on a reflector in a lithographic apparatus.

For comparison, a top view of a reflector 15 of the prior art is depicted in FIG. 6A, having three points at which forces are applied to the reflector 15. The points are labelled as p1, p2 and p3. FIG. 6A shows the forces applied by two actuators (not shown) at each point. For the reflector 15 shown in FIG. 6A, there are three points (P=3), six degrees of freedom (N=6) and six actuator devices (M=6) i.e. one actuator device for each degree of freedom to fully control the reflector 15. If the same number of actuators are used as the number of degrees of freedom, the controller 50 can determine the forces required by the actuators to resolve the parasitic forces in the reflector 15. An example of the prior art displaying the forces of the actuators on the reflector 15 is displayed in FIG. 6A in which F1, F2 and F3 are the desired forces. With Fp1 indicating the parasitic force i.e. the unwanted force acting on the reflector 15.

The controller 50 can be used to alter the forces using Fr2 and Fr3 applied by the actuators at the second and third point respectively, to resolve the net forces on the reflector 15 such that the net parasitic force is zero. However, in this example shown in FIG. 6A, the parasitic forces are resolved through the reflector 15. Deformations of the reflector 15 can result in errors of the image in the radiation beam and in the angle of the radiation beam as it reflects off the reflector 15.

Figure 6B:
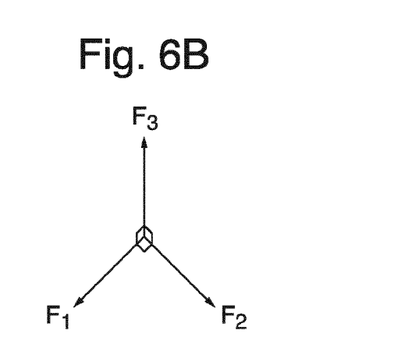
FIG. 6B shows a force diagram of the net desired forces of FIG. 6A.

The desired forces in FIG. 6A are depicted in FIG. 6B which shows F1, F2 and F3 as forces which are orthogonal to each other. These indicate three of the degrees of freedom which the positioning system is controlling. It should be noted that the orthogonal forces do not necessarily need to be coupled to actuators which are orthogonally placed. A decoupling matrix can be used for a coordinate transform of the forces applied by the actuators.

Figure 7:
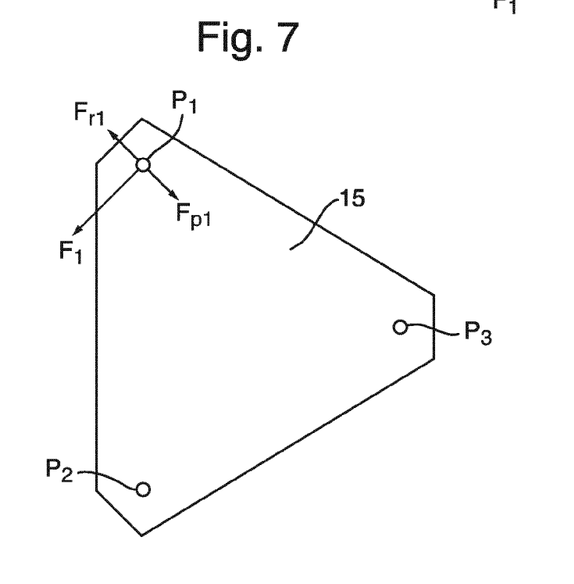
FIG. 7 depicts the forces at a point on a reflector in accordance with an embodiment of the present invention.

FIG. 7 shows a top view of a reflector in which the forces at the first point are in accordance with the second embodiment of the present invention. In this embodiment, there is an additional compensating actuator device at each point. Therefore, for example at point p1, two non-compensating actuator devices (not shown) can apply a force to the reflector 15. The actuators will be controlled by the controller 50 to ideally apply F1. Any errors or discrepancies in the force applied by the non-compensating actuator devices will result in a parasitic force modelled as Fp1 in FIG. 7. A compensating actuator device (not shown) can be applied at the same point, p1 to counteract the parasitic force Fp1 at this point.

By applying a force from a compensating actuator device at the same point as the non-compensating actuator devices, the forces can be resolved at the point p1 such that only the desired force F1 acts on the reflector 15 at this point. The points p2 and p3 can also have two non-compensating actuators and a compensating actuator at each point to resolve the forces at those points respectively.

Resolving the forces at the individual point means that the parasitic forces are not resolved through the reflector 15. Resolving the forces at a specific point (or at several specific points) means that parasitic forces are not transmitted through the reflector 15 and deformations in the reflector 15 can be reduced. This reduces any error in the position of the reflector 15 and any deformation of the reflector 15.

M and N could be any practical number of actuator devices and degrees of freedom respectively, as long as M is greater than N. As shown in the above embodiment, there is an advantage to M being greater than N at the same point, irrespective of whether the actuator devices are arranged to apply forces at the same point by applying forces from adjacent actuator devices at several contact points in close proximity, or if the actuator devices at the same point are connected and apply a single force to the reflector at a single contact point. As in the above embodiment, having one point at which N=2 and having M=3, with a compensating actuator device 200 applying a force at the same point as two non-compensating actuator devices provides the advantages described in the present application.

The embodiments and drawings depict forces for clarity. These have been simplified to help explain the forces applied by different actuators at different points on the reflector 15. The forces shown, for example in FIG. 3B are only in specific directions e.g. in one plane, however, the forces can be in all degrees of freedom. The force due to gravity on the reflector 15 has not been included in the force diagrams or figures. The principles of the present invention can be applied to more complicated systems. Furthermore, in the drawings, the ideal resultant forces have been shown in which the parasitic forces are entirely resolved such that the net parasitic forces are reduced to zero. One of the advantages of the present invention is that the parasitic forces can be reduced, even if the forces are not entirely resolved.

The effect of gravity on the position of the reflector 15 can change depending on the placement (i.e. the orientation) of the reflector 15, positioning system and controller 50 within the lithographic apparatus. The controller 50 will be able to factor in the effect of gravity by sensing the position of the reflector 15. A specific compensator actuator device may be selectively controlled by the controller 50 to apply a force to the reflector 15 to negate the force of gravity acting on the reflector 15.

The terminology used to describe the actuator devices has been used for clarity purposes. However, the term "compensating" and "non-compensating" have been used to help identify the way in which the actuator devices are being controlled, i.e. the compensating actuator device is used to apply a force to reduce the parasitic forces applied by at least one non-compensating actuator device. The controller 50 controlling the compensating actuator device and the non-compensating actuator device may control the devices to apply a specific force to the reflector 15. The devices could be the exact same type of device, the devices can be the same size, and/or the devices could be interchangeable. In this context, "interchangeable" means that although a compensating actuator device may be controlled to apply a compensating force, the controller may control the compensating actuator device to apply a non-compensating force and the device would from thereon be referred to as a non-compensating actuator. The same applies to a non-compensating actuator device in that the controller may change and control the device to apply a compensating force.

It may be beneficial to use different types of actuator to control one reflector 15. For example, it may be beneficial to use a larger, main actuator to implement the main forces on the reflector 15 and smaller actuators which are only configured to apply a small force, e.g. to reduce the parasitic forces on the reflector 15. This may be beneficial in that less volume is required than if the actuators are all of the same size. Additionally, this may benefit the dynamic behavior of the system. Using smaller, lighter actuators means that less weight is connected to the reflector which results in higher resonance frequencies which can be an advantage. Alternatively, it may be beneficial to control the actuators to apply forces of similar magnitudes to the reflector 15 i.e. for a compensating actuator device 200 to apply a similarly sized force to the reflector 15 as a non-compensating actuator device 300. As such the forces could be applied by actuators of the same type and size which may mean that the actuator devices are easier to source, replace and/or repair.

The present invention can be used in combination with any optical elements, or more specifically any reflectors, for use within the lithographic apparatus, the laser and/or the source collector.

The diagrams and embodiments of the present invention are shown using an xyz coordinate system. This coordinate system has been used for clarity. The angle of the support frame 20, the reflector 15 and/or the actuator devices of the positioning system can be altered. A different coordinate system may be used if desirable.

In the present invention, the term actuator device has been used to refer to a device for controlling the position of the reflector in one degree of freedom. Multiple actuators may be combined within one actuator device, for example a planar motor actuator in which two degrees of freedom are controlled. Therefore, for a planar motor actuator, this would be considered as two actuators with reference to the present invention. As such, the equivalent number of actuators for the purposes of the present invention is the same as the number of degrees of freedom controlled by the actuator device.

In accordance with the present invention, the positioning system and controller 50 as described in any of the above embodiments may be used to control the position of a component of the lithographic apparatus other than a reflector. Examples of other components which can be controlled in accordance with any of the above embodiments include, but are not limited to, components of EUV or DUV apparatus, for example in measurement systems, the mask table, the substrate table, in the laser, or in the source collector. The actuators can be applied to actively damp a component or to control, localize or dissipate vibrations in an apparatus, etc.

The positioning system of any of the above embodiments may be used to control an object to damp the oscillation of the object. The vibrations and/or oscillations of the object can be reduced by using the positioning system to compensate for the movement of the object. This provides advantages as described above for the previously described embodiments.

A method of manufacturing a substrate W in accordance with the present invention includes projecting a projection beam via a reflector to pattern the substrate W. The position of the reflector is controlled using a positioning system and a controller 50 to reduce any errors in the patterned beam as it reaches the substrate W. The method of manufacturing the substrate can use a lithographic apparatus in any of the embodiments or variations as described above.

In an embodiment, there is provided a positioning system for positioning an object, wherein the positioning system is configured to position the object in N degrees of freedom, wherein N is a positive integer, the positioning system comprising: M actuator devices, each actuator device being configured to apply a force to the object, and M being a positive integer greater than N, wherein at least one of the actuator devices is a compensating actuator device and at least one other of the actuator devices is a non-compensating actuator device; and a controller configured to control a compensating actuator device and a non-compensating actuator device wherein the controller is configured to control the compensating actuator device to compensate for parasitic forces of the non-compensating actuator device, wherein the compensating actuator device and the non-compensating actuator device are configured to apply a force to the object at the same point thereon.

In an embodiment, a further compensating actuator device and/or a further non-compensating actuator device are configured to apply a force to the same point and the controller is configured to control the further compensating actuator device and/or the further non-compensating actuator device. In an embodiment, there are P points at which a force is applied to the object, wherein P is a positive integer less than, or equal to, N. In an embodiment, N is two and M is three at the same point wherein there are two non-compensating actuator devices and one compensating actuator device. In an embodiment, P is three. In an embodiment, the controller is configured to control the at least one compensating actuator device and the at least one non-compensating actuator device such that the net force applied at each point is orthogonal to the net force applied at any of the other points. In an embodiment, any one of the M actuator devices includes an actuator which is either a Lorentz actuator or reluctance actuator. In an embodiment, the compensating actuator device and the non-compensating actuator device form an actuator which is a planar motor. In an embodiment, the actuator is connected to the object using at least one spring. In an embodiment, the actuator device is connected to a supporting frame using at least one spring. In an embodiment, the force applied by at least one actuator device is a linear force or a rotational force. In an embodiment, the object is an optical element, more preferably a reflector.

In an embodiment, there is provided a lithographic apparatus comprising a positioning system as described herein, wherein the lithographic apparatus further comprises the object and the object is a reflector.

In an embodiment, there is provided a method for compensating the vibration of an object using a positioning system as described herein.

In an embodiment, there is provided a device manufacturing method comprising projecting a projection beam of radiation via an optical element onto a substrate positioned on a substrate table, wherein a positioning system is configured to position the optical element in N degrees of freedom, wherein N is a positive integer, the positioning system comprising M actuator devices, each actuator device being configured to apply a force to the optical element, and M being a positive integer greater than N, wherein at least one of the actuator devices is a compensating actuator device and at least one other of the actuator devices is a non-compensating actuator device; and a controller is configured to control a compensating actuator device and a non-compensating actuator device wherein the controller is configured to control the compensating actuator device to compensate for parasitic forces of the non-compensating actuator device, wherein the compensating actuator device and the non-compensating actuator device are configured to apply a force to the optical element at the same point thereon.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. In the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

While specific embodiments of the invention have been described above, it will be appreciated that the invention, at least in the form of a method of operation of an apparatus as herein described, may be practiced otherwise than as described. For example, the embodiments of the invention, at least in the form of a method of operation of an apparatus, may take the form of one or more computer programs containing one or more sequences of machine-readable instructions describing a method of operating an apparatus as discussed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when one or more computer programs are read by one or more computer processors located within at least one component of the lithographic apparatus. The controllers may each or in combination have any suitable configuration for receiving, processing and sending signals. One or more processors are configured to communicate with at least one of the controllers. For example, each controller may include one or more processors for executing the computer programs that include machine-readable instructions for the methods of operating an apparatus as described above. The controllers may include data storage media for storing such computer programs, and/or hardware to receive such media. So the controller(s) may operate according to the machine readable instructions of one or more computer programs.

The descriptions above are intended to be illustrative, not limiting. Thus, it will be apparent to one skilled in the art that modifications may be made to the invention as described without departing from the scope of the claims set out below.

The invention claimed is:

1. A positioning system for positioning an object, wherein the positioning system is configured to position the object in N degrees of freedom, wherein N is a positive integer, the positioning system comprising:
   M actuator devices, each actuator device configured to apply a force to the object, and M being a positive integer greater than N, wherein at least one of the actuator devices is a compensating actuator device and at least one other of the actuator devices is a non-compensating actuator device; and
   a controller configured to control a compensating actuator device and a non-compensating actuator device,
   wherein the controller is configured to control the compensating actuator device to compensate for parasitic forces of the non-compensating actuator device, and
   wherein the compensating actuator device and the non-compensating actuator device are configured to apply a force to the object at the same point thereon.

2. The positioning system according to claim 1, wherein a further compensating actuator device and/or a further non-compensating actuator device are configured to apply a force to the same point and the controller is configured to control the further compensating actuator device and/or the further non-compensating actuator device.

3. The positioning system according to claim 1, wherein there are P points at which a force is applied to the object, wherein P is a positive integer less than, or equal to, N.

4. The positioning system according to claim 3, wherein N is two and M is three at the same point wherein there are two non-compensating actuator devices and one compensating actuator device.

5. The positioning system according to claim 3, wherein P is three.

6. The positioning system according to claim 1, wherein the controller is configured to control the at least one compensating actuator device and the at least one non-compensating actuator device such that the net force applied at each point is orthogonal to the net force applied at any of the other points.

7. The positioning system according to claim 1, wherein any one of the M actuator devices includes an actuator which is either a Lorentz actuator or a reluctance actuator.

8. The positioning system of claim 1, wherein the compensating actuator device and the non-compensating actuator device form an actuator which is a planar motor.

9. The positioning system according to claim 7, wherein the actuator is connected to the object using at least one spring.

10. The positioning system according to claim 8, wherein the actuator device is connected to a supporting frame using at least one spring.

11. The positioning system according to claim 1, wherein the force applied by at least one actuator device is a linear force or a rotational force.

12. The positioning system according to claim 1, wherein the object is an optical element.

13. A lithographic apparatus comprising the positioning system of claim 1, wherein the lithographic apparatus further comprises the object and the object is a reflector.

14. A method for compensating the vibration of an object, the method comprising positioning the object by the positioning system of claim 1.

15. A device manufacturing method comprising:
projecting a projection beam of radiation via an optical element onto a substrate positioned on a substrate table;
positioning the optical element in N degrees of freedom, wherein N is a positive integer, using a positioning system comprising M actuator devices, each actuator device being configured to apply a force to the optical element, and M being a positive integer greater than N, wherein at least one of the actuator devices is a compensating actuator device and at least one other of the actuator devices is a non-compensating actuator device; and
controlling a compensating actuator device and a non-compensating actuator device, the controlling comprising controlling the compensating actuator device to compensate for parasitic forces of the non-compensating actuator device, wherein the compensating actuator device and the non-compensating actuator device are configured to apply a force to the optical element at the same point thereon.

16. The method of claim 15, further comprising applying a force to the same point using a further compensating actuator device and/or a further non-compensating actuator device and controlling the further compensating actuator device and/or the further non-compensating actuator device.

17. The method of claim 15, wherein there are P points at which a force is applied to the object, wherein P is a positive integer less than, or equal to, N.

18. The method of claim 17, wherein N is two and M is three at the same point wherein there are two non-compensating actuator devices and one compensating actuator device.

19. The method of claim 15, comprising controlling the at least one compensating actuator device and the at least one non-compensating actuator device such that the net force applied at each point is orthogonal to the net force applied at any of the other points.

20. The method of claim 15, wherein the compensating actuator device and the non-compensating actuator device form an actuator which is a planar motor.

* * * * *